US012163225B2

(12) United States Patent
White et al.

(10) Patent No.: US 12,163,225 B2
(45) Date of Patent: Dec. 10, 2024

(54) TEMPERATURE-CONTROLLED CHEMICAL DELIVERY SYSTEM AND REACTOR SYSTEM INCLUDING SAME

(71) Applicant: ASM IP Holding B.V., Almere (NL)

(72) Inventors: Carl Louis White, Gilbert, AZ (US); Kyle Fondurulia, Phoenix, AZ (US); Timothy James Sullivan, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 261 days.

(21) Appl. No.: 16/944,241

(22) Filed: Jul. 31, 2020

(65) Prior Publication Data

US 2021/0040615 A1    Feb. 11, 2021

Related U.S. Application Data

(60) Provisional application No. 62/884,944, filed on Aug. 9, 2019.

(51) Int. Cl.
| | |
|---|---|
| *C23C 16/455* | (2006.01) |
| *C23C 16/448* | (2006.01) |
| *C23C 16/52* | (2006.01) |
| *C30B 25/16* | (2006.01) |
| *H01L 21/67* | (2006.01) |

(52) U.S. Cl.
CPC ...... *C23C 16/45561* (2013.01); *C23C 16/448* (2013.01); *C23C 16/455* (2013.01);
(Continued)

(58) Field of Classification Search
CPC ......... H01L 21/67017; H01L 21/67063; H01L 21/67069; H01L 21/67098;
(Continued)

(56) References Cited

U.S. PATENT DOCUMENTS 5,935,283 A * 8/1999 Sweeney ............... B01D 45/00
406/48
6,056,823 A * 5/2000 Sajoto ................. C23C 16/4401
118/715

(Continued)

FOREIGN PATENT DOCUMENTS

| JP | H07147249 A | 6/1995 |
|---|---|---|
| JP | 2004071849 A | 3/2004 |

(Continued)

*Primary Examiner* — Kurt Sweely
(74) *Attorney, Agent, or Firm* — Snell & Wilmer L.L.P.

(57) ABSTRACT

A temperature control system for a chemical delivery system (e.g., comprised in a reactor system) may comprise a temperature control shell coupled to and/or enclosing at least a portion of at least one component of the chemical delivery system. A chemical delivery system may comprise a filter, an accumulator, and/or a chemical application line fluidly coupled to one another in any suitable arrangement and/or configuration. A temperature control system for such a chemical delivery system may comprise a filter temperature control shell coupled to and/or enclosing at least a portion of the filter, an accumulator temperature control shell coupled to and/or enclosing at least a portion of the accumulator, and/or an application line temperature control shell coupled to and/or enclosing at least a portion of the chemical application line.

19 Claims, 8 Drawing Sheets

(52) U.S. Cl.
CPC ...... *C30B 25/165* (2013.01); *H01L 21/67248* (2013.01); *C23C 16/52* (2013.01); *H01L 21/67017* (2013.01)

(58) Field of Classification Search
CPC ......... H01L 21/67109; H01L 21/67248; C23C 16/4401; C23C 16/4402; C23C 16/4408; C23C 16/45512; C23C 16/45561; C23C 16/45563; C23C 16/45574; C23C 16/45578; C23C 16/466; C23C 16/4411; C23C 16/448; C23C 16/452; C23C 16/453; C23C 16/455; C23C 16/45504; C23C 16/45506; C23C 16/45508; C23C 16/4551; C23C 16/45525–45534; C23C 16/45544–45557; C23C 16/4557–45572; C23C 16/45585; C23C 16/52; H01J 37/3244; H01J 37/32449; H01J 37/32522; H01J 37/32091; H01J 37/321; H01J 37/32192; C30B 25/14; C30B 25/165

See application file for complete search history.

(56) References Cited

U.S. PATENT DOCUMENTS

| | | | |
|---|---|---|---|
| 6,110,529 A * | 8/2000 | Gardiner | C23C 16/408 505/445 |
| 6,333,272 B1 | 12/2001 | McMillin et al. | |
| 7,314,526 B1 | 1/2008 | Preti et al. | |
| 7,923,384 B2 * | 4/2011 | Tada | H01L 21/02274 438/789 |
| 8,846,539 B2 * | 9/2014 | Dhindsa | H01J 37/32724 438/726 |
| 2002/0042205 A1 * | 4/2002 | McMillin | H01L 21/67017 438/710 |
| 2002/0086260 A1 * | 7/2002 | Shang | H01L 21/67109 432/247 |
| 2003/0033978 A1 * | 2/2003 | Zhao | C23C 16/4481 118/724 |
| 2003/0101938 A1 * | 6/2003 | Ronsse | C23C 16/4401 118/712 |
| 2007/0009649 A1 | 1/2007 | Nakamura et al. | |
| 2007/0295274 A1 | 12/2007 | Webb et al. | |
| 2009/0263578 A1 | 10/2009 | Lindfors et al. | |
| 2010/0227476 A1 * | 9/2010 | Peck | C23C 16/40 257/E21.295 |
| 2011/0135821 A1 * | 6/2011 | Ding | G05D 16/02 118/692 |
| 2011/0217208 A1 | 9/2011 | Narendrnath et al. | |
| 2013/0160709 A1 | 6/2013 | White et al. | |
| 2014/0106577 A1 * | 4/2014 | Tonegawa | H01L 21/0228 438/791 |
| 2015/0177745 A1 * | 6/2015 | Chen | G05D 16/204 137/12 |

FOREIGN PATENT DOCUMENTS

| | | |
|---|---|---|
| JP | 2004273693 A | 9/2004 |
| JP | 2007288197 A | 11/2007 |

* cited by examiner

FIG. 5 ature-controlled chemical delivery system and reactor system including same

CROSS-REFERENCE TO RELATED APPLICATIONS

This application is a nonprovisional of, and claims priority to and the benefit of, U.S. Provisional Patent Application No. 62/884,944, filed Aug. 9, 2019 and entitled "TEMPERATURE-CONTROLLED CHEMICAL DELIVERY SYSTEM AND REACTOR SYSTEM INCLUDING SAME," which is hereby incorporated by reference herein.

FIELD OF DISCLOSURE

The present disclosure generally relates to gas-phase reactors and systems. More particularly, the disclosure relates to temperature-controlled chemical delivery systems, to reactor systems including temperature-controlled chemical delivery systems, and to methods of using the same.

BACKGROUND OF THE DISCLOSURE

Gas-phase reactors, such as those use for chemical vapor deposition (CVD), plasma-enhanced CVD (PECVD), atomic layer deposition (ALD), and the like, can be used for a variety of applications, including depositing and etching materials on a substrate surface. For example, gas-phase reactors can be used to deposit and/or etch layers on a substrate to form semiconductor devices, flat panel display devices, photovoltaic devices, microelectromechanical systems (MEMS), and the like.

A typical gas-phase reactor system includes a reactor including a reaction chamber, one or more precursor gas sources fluidly coupled to the reaction chamber, one or more carrier and/or purge gas sources fluidly coupled to the reaction chamber, and/or a vacuum source.

Various reactors may desirably run at elevated temperatures to obtain desired reactions within the reaction chamber, and particularly on or near a surface of a substrate. For example, gas-phase reactors can often operate at temperatures of 200° C. or higher. Additionally, precursor or reactant gases may be delivered to the reaction chamber at an elevated temperature, especially when the precursor or reactant gases originate from solid or liquid sources. Particularly when precursors or reactants are derived from liquid or solid sources, undesirable condensation can occur in a delivery path between a source and the reaction chamber. In some case, the delivery path can be heated to mitigate condensation. However, if the precursors or reactants heated to a temperature that is too high, decomposition of the precursors or reactants occurs. Accordingly, improved temperature-controlled chemical delivery systems, such as those comprised in reactor systems, are desired.

SUMMARY OF THE DISCLOSURE

Various embodiments of the present disclosure relate to temperature control systems of a chemical delivery system, temperature-controlled chemical delivery systems, reactor systems including the temperature control systems and temperature-controlled chemical delivery systems, and to methods of using the same. In various embodiments, a temperature control system for a chemical delivery system may comprise various heating shells configured to couple to and encapsulate the chemical delivery system, or a portion(s) of the chemical delivery system. Therefore, a precursor or reactant gas (or vapor or any other type of gas) being delivered through a chemical delivery system to a reaction chamber may be maintained at a target temperature (or within a temperature range) at various points throughout the chemical delivery system. The target temperature may be between a sublimation or evaporation temperature of the respective compound (to keep the compound in gas phase) and a decomposition temperature, at which the compound may decompose or otherwise degrade. Additionally, the target temperature may be a temperature preventing the precursor or reactant gas from condensing or depositing at a point through the chemical delivery system.

In various embodiments, a temperature control system for a chemical delivery system (e.g., comprised in a reactor system) may comprise a temperature control shell coupled to and/or enclosing at least a portion of at least one component of the chemical delivery system. In various embodiments, a chemical delivery system may comprise a chemical delivery line, a filter, an accumulator, and/or a chemical application line. The components of a chemical delivery system may be fluidly coupled to one another in any suitable arrangement or order. For such a chemical delivery system, for example, a temperature control system may comprise a delivery line temperature control shell coupled to and/or enclosing at least a portion of the chemical delivery line, a filter temperature control shell coupled to and/or enclosing at least a portion of the filter, an accumulator temperature control shell coupled to and/or enclosing at least a portion of the accumulator, and/or an application line temperature control shell coupled to and/or enclosing at least a portion of the chemical application line. A temperature control shell of the temperature control system may comprise any suitable material configured to disperse and/or distribute thermal energy (e.g., a conductive material, such as a metal comprising aluminum, steel, and/or the like).

In various embodiments, a component of the chemical delivery system may be disposed within a cavity of a respective temperature control shell. In various embodiments, two or more pieces of a temperature control shell may couple together to form the temperature control shell and the cavity therein configured to receive the chemical delivery system component. In various embodiments, each temperature control shell in a temperature control system for a chemical delivery system may comprise a temperature adjustment device (e.g., a heater and/or cooler) configured to adjust the temperature of the respective temperature control shell. Each temperature adjustment device may be comprised within and/or coupled to one or more respective temperature control shells. Each temperature adjustment device may be in electronic communication with a controller configured to adjust the temperature of the temperature adjustment device, and thereby, adjust the temperature of the respective temperature control shell and chemical delivery component.

In various embodiments, a chemical delivery system (e.g., such as a chemical delivery system comprised in a reactor system) comprises the temperature control system as described herein. A reactor system comprising a chemical delivery system including a temperature control system described herein, may further comprise include one or more reaction chambers, one or more gas manifolds, one or more precursor sources, one or more vacuum sources, one or more robotic transfer arms, and/or the like.

In various embodiments, a method of delivering a chemical to a reaction chamber may comprise heating or cooling at least one temperature control shell of a temperature control system coupled to a respective component of a chemical delivery system; flowing the chemical through the chemical delivery system; and/or applying the chemical into the reaction chamber. Heating or cooling of the at least one temperature control shell may occur before, during, and/or after flowing the chemical through the chemical delivery system. Heating or cooling at least one control shell may occur via a temperature adjustment device (e.g., a heater and/or cooler) comprised in and/or coupled to a respective temperature control shell. In various embodiments, the temperature adjustment device may be in electronic communication with a controller configured to control the heating and/or cooling of the temperature control device, the respective temperature control shell, a thermocouple, and/or the respective component of the chemical delivery system.

BRIEF DESCRIPTION OF THE DRAWING FIGURES

A more complete understanding of exemplary embodiments of the present disclosure can be derived by referring to the detailed description and claims when considered in connection with the following illustrative figures. Elements with the like element numbering throughout the figures are intended to be the same.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure. Additionally, the steps of an illustrated method may be performed in any suitable order and/or combination, in accordance with various embodiments of the present disclosure.

DETAILED DESCRIPTION OF EXEMPLARY EMBODIMENTS OF THE DISCLOSURE

The description of exemplary embodiments provided below is merely exemplary and is intended for purposes of illustration only. The following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates temperature-controlled chemical delivery systems, such as those comprised in a reactor system. The reactor system may be used to process substrates, such as semiconductor wafers, in gas-phase reactors. By way of examples, the systems described herein can be used to form or grow epitaxial layers (e.g., two component and/or doped semiconductor layers) on a surface of a substrate.

As used herein, a "substrate" refers to any material having a surface onto which material can be deposited. A substrate may include a bulk material such as silicon (e.g., single crystal silicon) or may include one or more layers overlying the bulk material. Further, the substrate may include various topologies, such as trenches, vias, lines, and the like formed within or on at least a portion of a layer of the substrate.

Figure 1A:
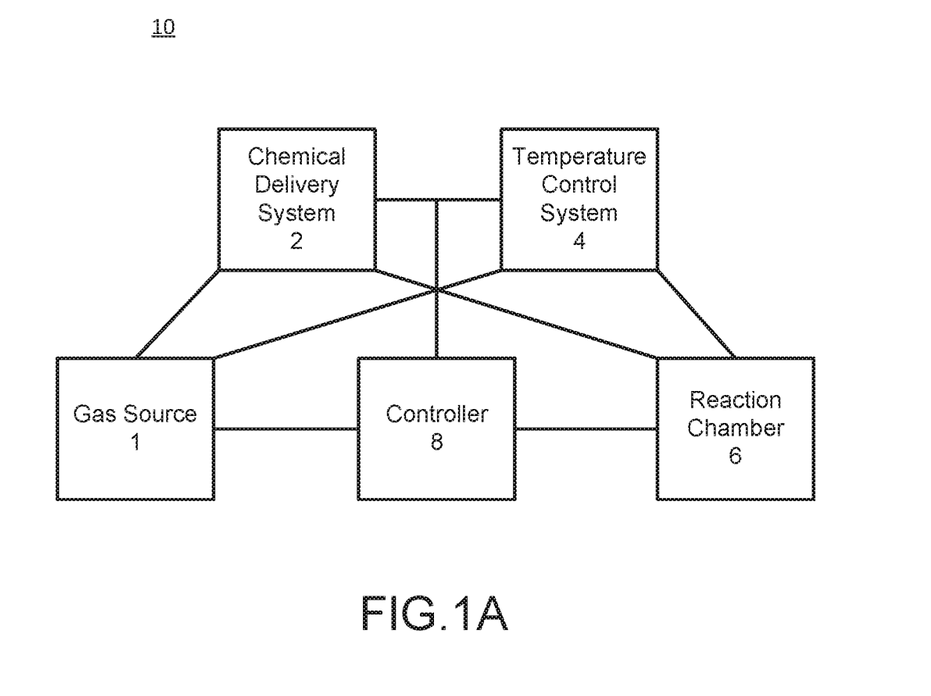
FIG. 1A illustrates a block diagram of a reactor system and the components therein, in accordance with various embodiments of the present disclosure.

FIG. 1A illustrates a block diagram of a reactor system 10 and them components therein, in accordance with various embodiments. In various embodiments, reactor system 10 may comprise a gas source 1, a chemical delivery system 2, a temperature control system 4, a reaction chamber 6, and/or a controller 8. The components of reactor system 10 may be coupled to one another (e.g., physically, fluidly, electronically, thermally, operatively, and/or the like), as appropriate. For example, gas source 1, chemical delivery system 2, and/or reaction chamber 6 may be physically and/or fluidly coupled to one another. As another example, chemical delivery system 2 and a temperature control system 4 may be physically and/or thermally coupled to one another. As yet another example, controller 8 may be electronically, physically, and/or operatively coupled to any one or combination of the other components of reactor system 10.

As set forth in more detail below, various sections or components of a chemical delivery system may be temperature-controlled (i.e., heated or cooled) to maintain a desired temperature. This allows delivery of chemicals (e.g., precursor or reactant gases) through the chemical delivery system and to a reaction chamber, while avoiding adverse effects to the chemical (e.g., condensation or deposition of the chemical in the chemical delivery system resulting from the temperature therethrough being too low, or degradation or decomposition of the chemical resulting from the temperature being too high). In response to the ability of a temperature control system to maintain a desired temperature throughout a chemical delivery system (i.e., maintaining a temperature with more precision), chemicals that may have a relatively small temperature range between a condensation or sublimation temperature and a decomposition temperature may be delivered to a reaction chamber through temperature-controlled chemical delivery system with encountering issues during delivery. Additionally or alternatively, chemicals, such as precursor and reactants, can be delivered between a source and a reaction chamber over a longer distance.

Figure 1B:
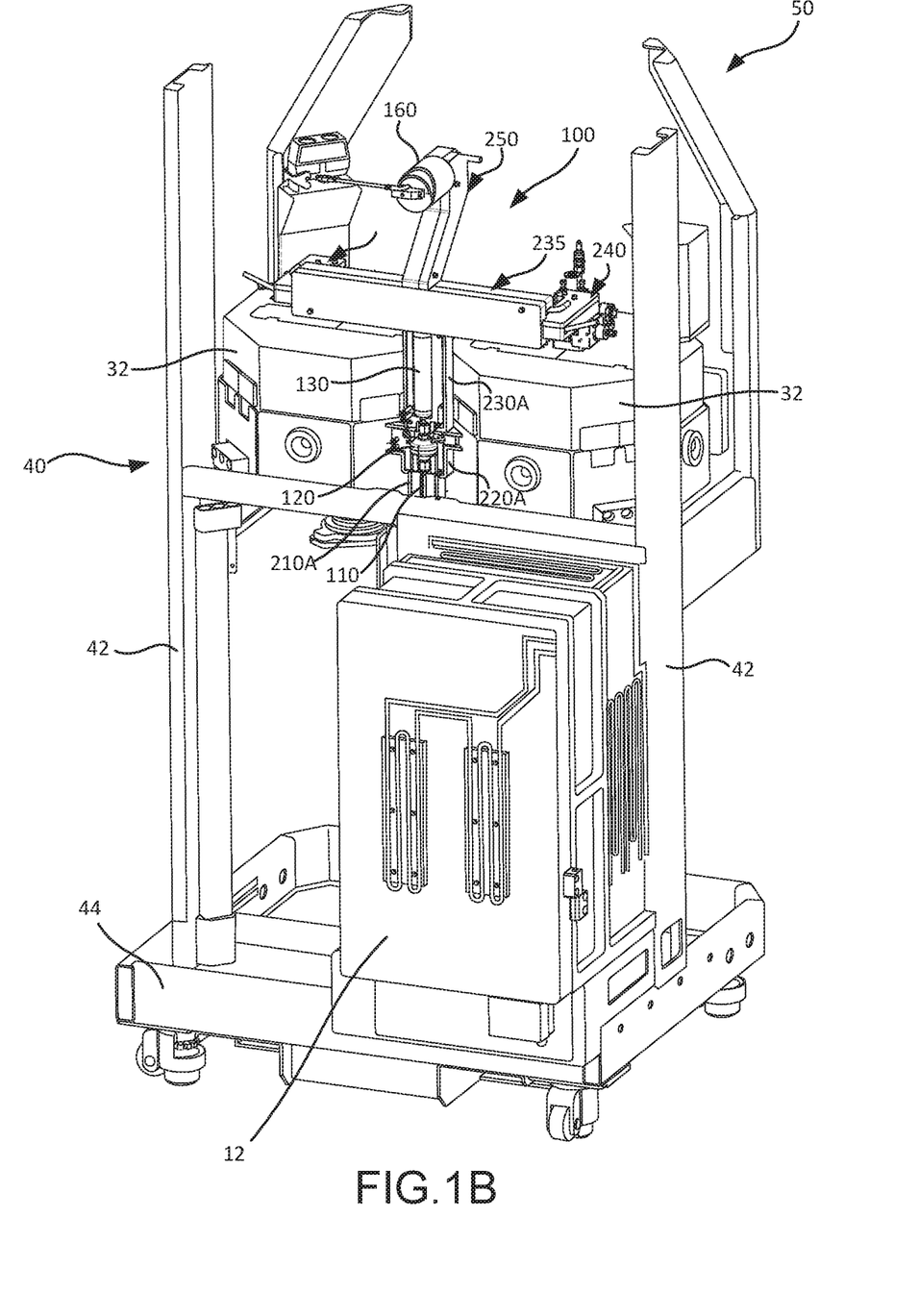
FIG. 1B illustrates a perspective view of a reactor system comprising a chemical delivery system, in accordance with various embodiments of the present disclosure.
Figure 1C:
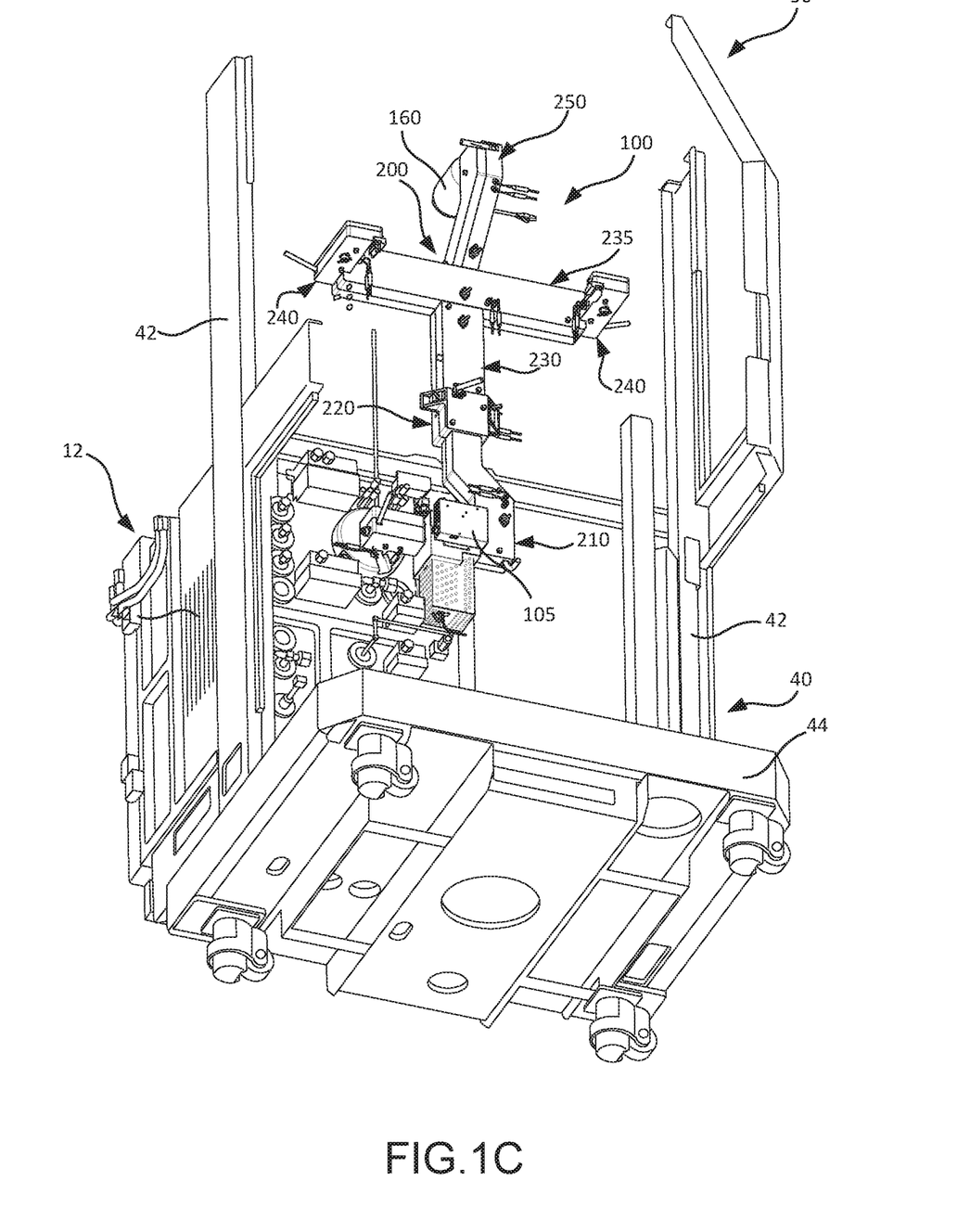
FIG. 1C illustrates a perspective view of the reactor system of FIG. 1B without reaction chambers, in accordance with various embodiments of the present disclosure.

In accordance with various embodiments, FIGS. 1B and 1C illustrate an exemplary reactor system 50. Reactor system 50 (an example of reactor system 10 in FIG. 1A) can be used for a variety of applications, such as, for example, chemical vapor deposition (CVD), plasma-enhanced CVD (PECVD), atomic layer deposition (ALD), clean processes, etch processes, and/or the like. Although exemplary embodiments are described below in connection with epitaxial reactor systems, the embodiments and the invention are not so limited, unless stated otherwise.

In various embodiments, reactor system 50 may comprise a gas source 12 (an example of gas source 1), a chemical delivery system 100 (an example of chemical delivery system 2 in FIG. 1A), and/or a reaction chamber 32 (an example of reaction chamber 6 in FIG. 1A). In various embodiments, reactor system may comprise multiple reaction chambers 32 (such as the two reaction chambers 32 pictured in reactor system 50 of FIG. 1B) and/or gas sources 12, and/or multiple gas sources may be comprised in gas source 12. The components of reactor system 50 may be coupled to a structural frame 40 comprising base 44 and beams 42 coupled thereto. Structural frame 40 may support the components of reactor system 50 in a desired arrangement or configuration.

During operation of reactor system 50, substrates, such as semiconductor wafers, (not illustrated) are transferred from, e.g., a substrate handling system (not illustrated), to reaction chamber 32. Once substrate(s) are transferred to reaction chamber 32, one or more gases, such as precursors, dopants, carrier gasses, and/or purge gasses are introduced into reaction chamber 32 via chemical delivery system 100. Any unreacted gasses and/or reaction byproducts may exit reaction chamber 32 and flow through an exhaust source.

In various embodiments, gas source 12 may comprise one or more gases, or materials that become gaseous (e.g., from a solid source delivery system), that are used in deposition, etch, clean, purge, or treatment processes. Accordingly, the gases, or materials that become gaseous, in gas source 12 may be a precursor or reactant, purge gas, and/or the like. Exemplary gas sources include nitrogen trifluoride ($NF_3$), ammonia ($NH_3$), water vapor ($H_2O$), hydrogen peroxide ($H_2O_2$), MMH (mono methyl hydrazine), UDMH (unsymmetrical dimethyl hydrazine), $O_2/H_2$, $N_2/H_2$, and $H_2S$.

Figure 2:
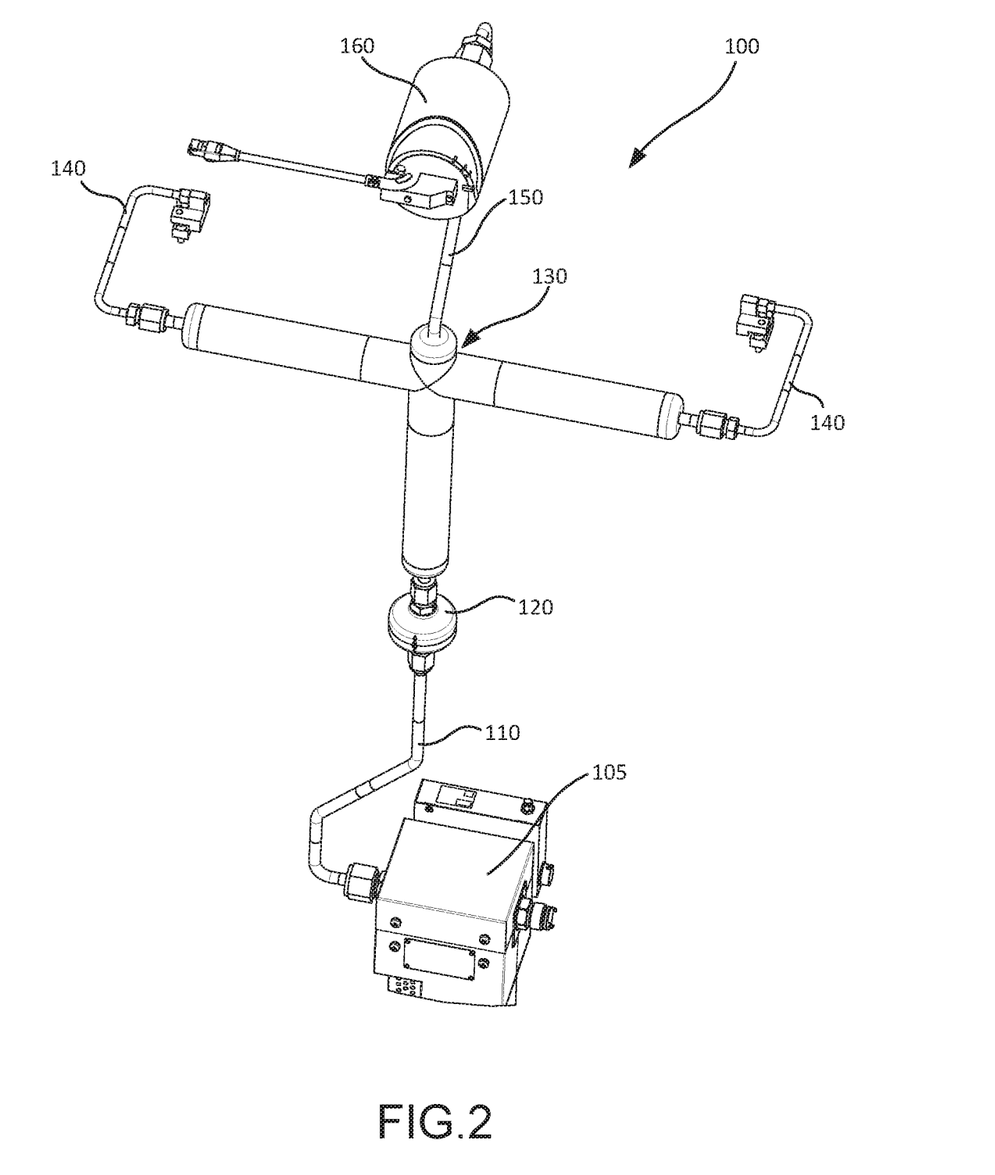
FIG. 2 illustrates a chemical delivery system, in accordance with various embodiments of the present disclosure.

With additional reference to FIG. 2, chemical delivery system 100 may be configured to deliver a gas (e.g., a precursor or reactant gas), purge gas, or any other suitable gas from gas source 12 to reaction chamber 32. Chemical delivery system 100 may comprise a mass flow controller (e.g., mass flow controller 105) and/or a mass flow meter, a filter (e.g., filter 120) fluidly coupled to and downstream from mass flow controller 105, an accumulator (e.g., accumulator 130) fluidly coupled to and downstream from filter 120, and/or a chemical application line (e.g., chemical application line 140) fluidly coupled to and downstream from accumulator 130.

Mass flow controller 105 may be fluidly coupled to gas source 12, and may be configured to control a flowrate of the gas delivered to reaction chamber 32. Exemplary flowrates can range from, for example, about 2 L/min. to about 5.0 L/min, and/or about 0.5 L/min. to about 2.0 L/min. Mass flow controller 105 may be heated (e.g., by comprising a heater therein and/or thereon).

In various embodiments, chemical delivery system 100 may comprise a filter (e.g., filter 120) fluidly coupled to mass flow controller 105. Chemical delivery line 110 (a fluid channel) may fluidly couple mass flow controller 105 to filter 120, or filter 120 may be directly coupled to mass flow controller 105. Filter 120 may filter out or remove any particulates or contaminants in the gas flowing through chemical delivery system 100 from gas source 12.

In various embodiments, chemical delivery system 100 may comprise an accumulator (e.g., accumulator 130) fluidly coupled to filter 120. Accumulator 130 may be downstream of filter 120. In various embodiments, accumulator 130 may be any suitable shape, such as a T shape (as depicted in FIG. 2), a linear shape with any suitable cross-sectional shape, and/or the like. Accumulator 130 may comprise an inlet valve, which, when open, allows gas from gas source 12 into accumulator 130, and when closed, prevents gas from gas source 12 entering accumulator 130. Accumulator 130 may comprise an outlet valve which may be closed to prevent gas from exiting accumulator 130 (e.g., into chemical application line 140), or opened to allow gas to exit accumulator 130. In operation of chemical delivery system 100 and/or reactor system 50, gas may be allowed into accumulator 130 and accumulate therein by the accumulator inlet valve being open and the accumulator outlet valve being closed, until a desired pressure level of the gas in accumulator 130 is reached. In response, the accumulator inlet valve may be closed. The gas under the desired pressure in accumulator 130 may then be released to flow through chemical application line 140 to be delivered and applied into reaction chambers 32. In at least one embodiment, the chemical delivery system 100 may be located a long distance away from the reaction chamber. Therefore, a delivery line connecting the chemical delivery system 100 to the reaction chamber may serve as a large accumulator for the gas. Advantages from this may include a smaller pressure drop, allowing for more consistent pulsing dosages.

In various embodiments, chemical delivery system 100 may comprise a pressure transducer (e.g., pressure transducer 160) coupled to accumulator 130. Pressure transducer 160 may be fluidly coupled to accumulator 130, for example, by a pressure line 150, and configured to measure the pressure in accumulator 130. For example, chemical delivery system may allow gas to accumulate in accumulator 130 up to a desired pressure threshold within accumulator 130. In response to the desired pressure being reached in accumulator 130, as detected by pressure transducer 160, the accumulator inlet valve may close so additional gas does not enter accumulator 130, and/or the accumulator outlet valve may open to allow gas to exit accumulator 130.

In various embodiments, chemical delivery system 100 may comprise a chemical application line 140 (or multiple chemical application lines 140 as illustrated in FIG. 2). Chemical application line 140 (a fluid channel) may be fluidly coupled to accumulator 130 to deliver gas from accumulator 130 to reaction chamber 32. Gas may flow through chemical application line 140 in response to the accumulator outlet valve opening allowing gas to flow from the accumulator 130. Chemical application line 140 may be fluidly coupled to a gas distribution system, which may be configured to mix gases from various gas sources and/or disperse gases into reaction chamber 32. An exemplary gas distribution system is described in U.S. Pat. No. 8,152,922 to Schmidt et al., issued Apr. 10, 2012, entitled "Gas Mixer and Manifold Assembly for ALD Reactor," the contents of which are hereby incorporated herein by reference, to the extent the contents do not conflict with the present disclosure. By way of example, the distribution system may include a showerhead gas distribution system.

In various embodiments, a chemical delivery system may comprise any combination of components, such as those discussed herein, in any suitable fluid order. Additionally, a chemical delivery system may comprise fewer components than, or additional components to, those components comprised in chemical delivery system 100 (e.g., additional filters, accumulators, more or fewer fluid channels, etc.).

As discussed herein, the gases delivered to reaction chamber 32 through chemical delivery system 100 may be temperature-sensitive and/or have other temperature requirements to maintain the chemical in a gaseous state (e.g., at a temperature above an evaporation or sublimation temperature), while avoiding degradation or decomposition of the chemical (e.g., at a temperature below a decomposition temperature). Accordingly, with additional reference to FIGS. 3, 4A, and 4B, reactor system 50 and/or chemical delivery system 100 may comprise a temperature control system (e.g., temperature control system 200) to regulate the temperature throughout one or more of the components of chemical delivery system 100. The temperature control system may comprise one or more temperature control shells to couple to and enclose one or more components of the chemical delivery system.

Figure 3:
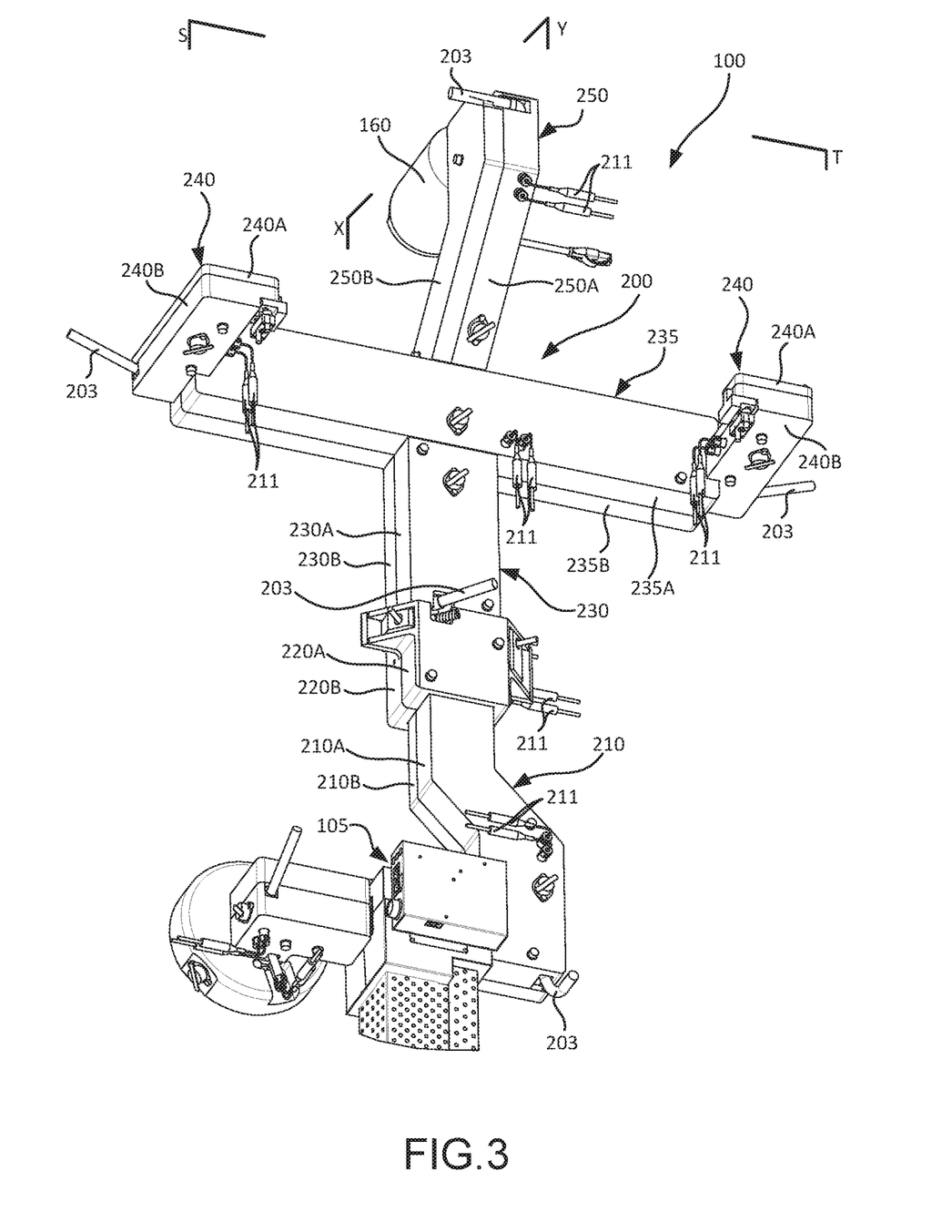
FIG. 3 illustrates a chemical delivery system including a temperature control system, in accordance with at least one exemplary embodiment of the disclosure.

In various embodiments, temperature control system 200 (an example of temperature control system 4 in FIG. 1A) may comprise at least one temperature control shell to enclose at least one component of chemical delivery system 100. In various embodiments, temperature control system 200 may comprise a delivery line temperature control shell 210 configured to couple to and enclose chemical delivery line 110, a filter temperature control shell 220 configured to couple to and enclose filter 120, an accumulator temperature control shell configured to couple to and enclose accumulator 130, an application line temperature control shell 240 configured to couple to and enclose chemical application line 140, and/or a pressure line temperature control shell 250 configured to couple to and enclose pressure line 150.

In various embodiments, the temperature control shell for each component of a chemical delivery system may comprise one or more parts that couple together to couple to and enclose the respective component of the chemical delivery system. For example, the temperature control shell for each component of a chemical delivery system may be a clamshell heater or clamshell temperature control device. Following with this example, in various embodiments, filter temperature control shell 220 may comprise a first filter shell piece 220A and a second filter shell piece 220B, the accumulator temperature control shell may comprise a first accumulator shell piece and a second accumulator shell piece, and/or application line temperature control shell 240 may comprise a first application line shell piece 240A and a second application line shell piece 240B. Similarly, in various embodiments, delivery line temperature control shell 210 may comprise a first delivery line shell piece 210A and a second delivery line shell piece 210B, and/or pressure line temperature control shell 250 may comprise a first pressure line shell piece 250A and a second pressure line shell piece 250B.

Accumulator 130, being T-shaped in the illustrated example, may have one temperature control shell, or may have multiple temperature control shells, coupled thereto. For example, as illustrated in FIG. 3, the accumulator temperature control shell for accumulator 130 may comprise one T-shaped temperature control shell, or may comprise a vertical accumulator temperature control shell 230 (having a first vertical accumulator shell piece 230A and a second vertical accumulator shell piece 230B) and a horizontal accumulator temperature control shell 235 (having a first horizontal accumulator shell half 235A and a second horizontal accumulator shell half 235B).

In various embodiments, a temperature control shell for any component of a chemical delivery system may comprise any number of shells to couple to and enclose the respective component or a portion thereof.

Figure 4A:
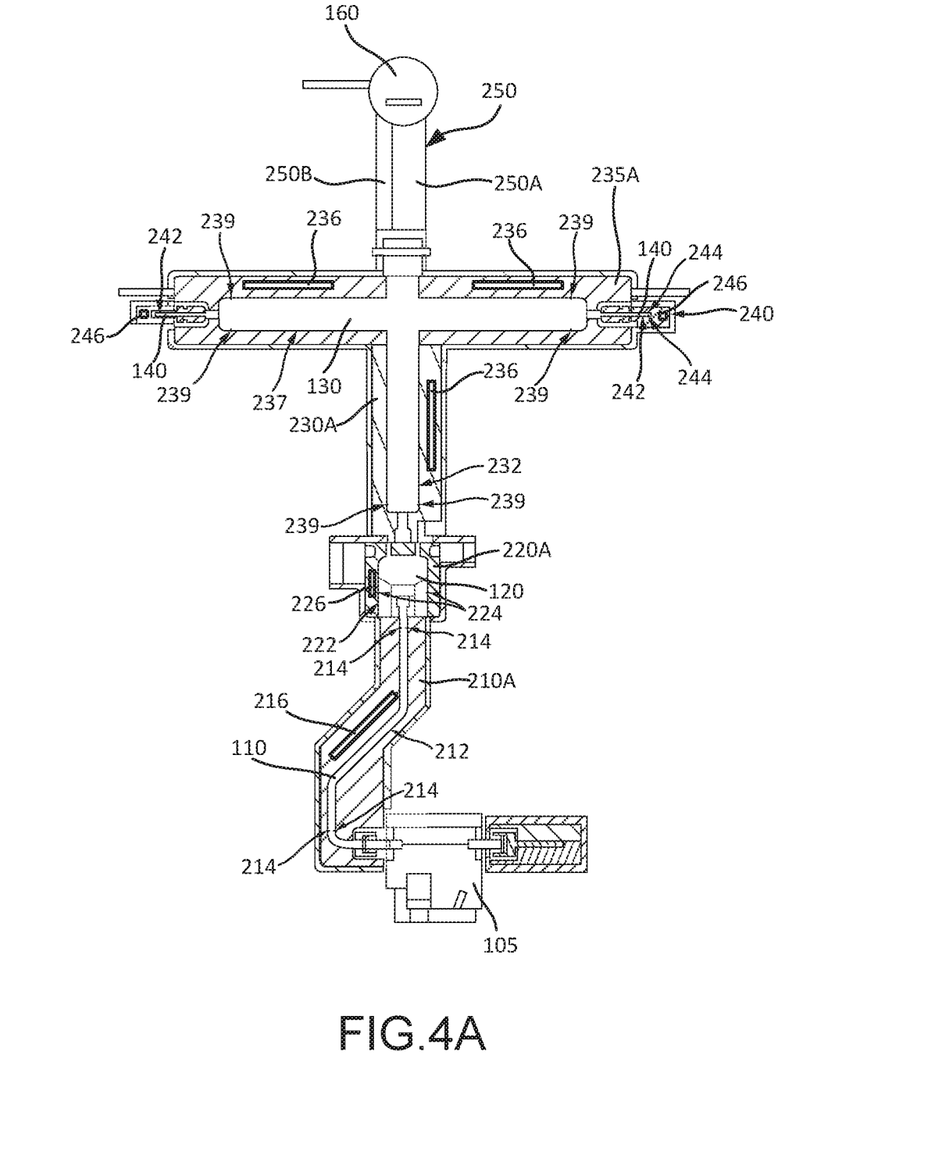
FIG. 4A illustrates a cross-sectional view of the chemical delivery system and the temperature control system of FIG. 3 along line S-T, in accordance with various embodiments of the present disclosure.
Figure 4B:
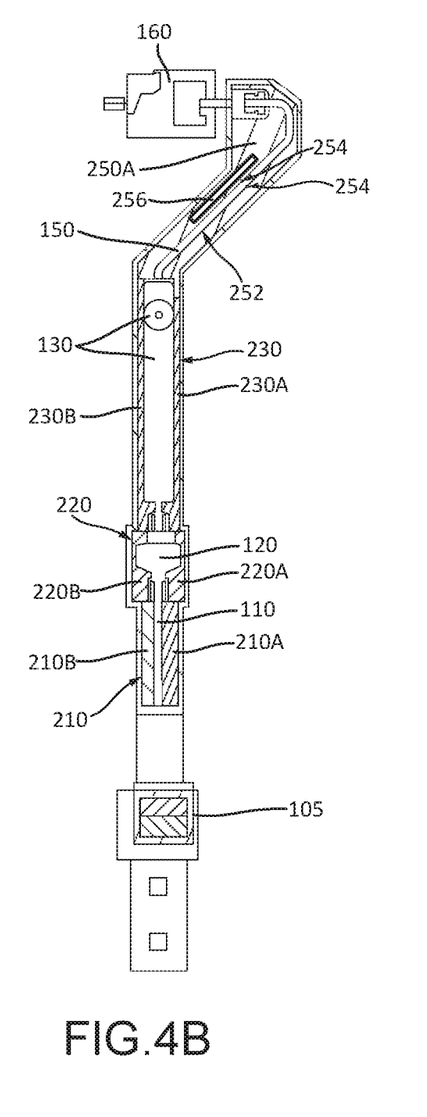
FIG. 4B illustrates a cross-sectional view of the chemical delivery system and the temperature control system of FIG. 3 along line X-Y, in accordance with various embodiments of the present disclosure.

In various embodiments, a temperature control shell for any component of a chemical delivery system may comprise a component cavity having a shape that is complementary to the shape of the respective chemical delivery system component. Accordingly, the respective chemical delivery system component may be disposed in the component cavity. For example, delivery line temperature control shell 210 may comprise a delivery line shell cavity 212, filter temperature control shell 220 may comprise a filter shell cavity 222, an accumulator temperature control shell may comprise an accumulator shell cavity (e.g., vertical accumulator shell cavity 232 and/or horizontal accumulator shell cavity 237), application line temperature control shell 240 may comprise an application line shell cavity 242, and/or pressure line temperature control shell 250 may comprise a pressure line shell cavity 252.

As discussed herein, the temperature control shell for each component of chemical delivery system 100 may comprise multiple (two or more) pieces coupling together to form each temperature control shell (e.g., two pieces for each chemical delivery system component's temperature control shell). Accordingly, in various embodiments wherein the temperature control shell for each component of chemical delivery system 100 comprises two pieces, each of the two pieces may comprise a component half cavity, wherein the component half cavity of each of the two pieces of the component temperature control shell together form the shell cavity in which the chemical delivery system 100 component may be disposed. The half cavities comprised in each of the two pieces do not necessarily make-up half of the resulting component cavity, but at least a portion of the resulting component cavity. For example, each of the two pieces 210A and 210B of delivery line temperature control shell 210 may comprise a delivery line half cavity that is complementary to chemical delivery line 110, wherein the delivery line half cavity of each of the two pieces 210A and 210B of delivery line temperature control shell 210 together form delivery line shell cavity 212. As another example, each of the two pieces 220A and 220B of filter temperature control shell 220 may comprise a filter half cavity that is complementary to filter 120, wherein the filter half cavity of each of the two pieces 220A and 220B of filter temperature control shell 220 together form filter shell cavity 222. As another example, each of the two pieces of the accumulator temperature control shell may comprise an accumulator half cavity that is complementary to accumulator 130, wherein the filter half cavity of each of the two pieces of the accumulator temperature control shell together form the accumulator shell cavity (e.g., vertical accumulator shell cavity 232 and/or horizontal accumulator shell cavity 237). As another example, each of the two pieces 240A and 240B of application line temperature control shell 240 may comprise an application line half cavity that is complementary to chemical application line 140, wherein the application line half cavity of each of the two pieces 240A and 240B of application line temperature control shell 240 together form application line shell cavity 242. As yet another example, each of the two pieces 250A and 250B of pressure line temperature control shell 250 may comprise a pressure line half cavity that is complementary to pressure line 150, wherein the pressure line half cavity of each of the two pieces 250A and 250B of pressure line temperature control shell 250 together form pressure line shell cavity 252. Each chemical delivery system component shell may comprise more than two pieces coupling together to enclose at least a portion of the respective component, in various embodiments.

In various embodiments, the temperature control shell for the respective component of chemical delivery system 100 may be in direct contact with at least a portion of the respective component of chemical delivery system 100. In various embodiments, the temperature control shell for the respective component of chemical delivery system 100 may minimize direct contact with the respective component of chemical delivery system 100, such that the respective component of chemical delivery system 100 floats in the temperature control shell cavity. In other words, a majority of the edges of a temperature control shell cavity for a respective component of chemical delivery system 100 may be proximate to, but not in direct contact with, the chemical delivery system 100 component disposed therein (wherein "majority" in this context means greater than 50% of the cavity surface area, greater than 70% of the cavity surface area, greater than 90% of the cavity surface area, greater than 95% of the cavity surface area, or greater than 98% of the cavity surface area). Minimal direct contact between the temperature control shell and the respective chemical delivery system 100 component disposed in the temperature control shell cavity may avoid causing significant temperature differences between portions of a chemical delivery system 100 component in direct contact with the temperature control shell versus portions spaced from the temperature control shell. For example, a portion of a chemical delivery system 100 component in direct contact with a temperature control shell may cause a hot or cold spot (depending on if the temperature control shell is heating or cooling the chemical delivery system 100 component) at the point of direct contact.

To achieve minimal direct contact between the edges of a temperature control shell cavity for a respective component of chemical delivery system 100 and such component, each temperature control shell of temperature control system 200 may comprise retainer protruding into the cavity of the temperature control shell. The retainer may be a protrusion into the temperature control shell cavity configured to directly contact at least a portion of a cross section (or an outer surface of a cross section) of the chemical delivery system 100 component disposed therein. The surface area of the retainer may be minimal to minimize the amount of direct contact between the temperature control shell and the chemical delivery system 100 component disposed therein.

Each temperature control shell may comprise one or more retainers protruding into the respective temperature control shell cavity configured to hold the component of chemical delivery system 100 disposed therein in place, again, with minimal direct contact. For example, delivery line temperature control shell 210 may comprise at least one delivery line retainer 214, filter temperature control shell 220 may comprise at least one filter retainer 224, the accumulator temperature control shell may comprise at least one accumulator retainer 239, application line temperature control shell 240 may comprise at least one application line retainer 244, and/or pressure line temperature control shell 250 may comprise at least one pressure line retainer 254. In various embodiments, no other portion of a temperature control shell may directly contact the respective component of chemical delivery system 100 disposed therein, other than the retainer(s) comprised in the respective temperature control shell.

In various embodiments, each temperature control shell of temperature control system 200 may comprise one or more temperature adjustment elements (e.g., one or more heaters to increase, and/or one or more coolers to decrease, the temperature of the temperature control shell and the chemical delivery system 100 component disposed therein). For example, delivery line temperature control shell 210 may comprise delivery line shell temperature adjustment element 216, filter temperature control shell 220 may comprise a filter shell temperature adjustment element 226, the accumulator temperature control shell may comprise a accumulator shell temperature adjustment element 236, application line temperature control shell 240 may comprise an application line shell temperature adjustment element 246, and/or pressure line temperature control shell 250 may comprise a pressure line shell temperature adjustment element 256. The temperature adjustment element may be coupled to an electricity source, or other source to facilitate heating or cooling, by couplers 203.

The temperature adjustment elements in each temperature control shell of temperature control system 200 may be coupled to and/or incorporated into the respective temperature control shell in any suitable manner. For example, a temperature adjustment element may be embedded into the respective temperature control shell, such that at least a portion of the temperature adjustment element is surrounded by the material of the temperature control shell. As another example, a temperature adjustment element may be coupled to an outer surface of a temperature control shell.

In various embodiments in which the one or more temperature adjustment elements in each temperature control shell of temperature control system 200 comprises a heater, the heater may be any suitable heater, such as a cartridge heater. In various embodiments in which the one or more temperature adjustment elements in each temperature control shell of temperature control system 200 comprises a cooling element, the cooling element may be any suitable device, such as a cooling coil.

In various embodiments, each temperature control shell of temperature control system 200 may comprise a material that facilitates the transfer of thermal energy (e.g., a conductor). For example, a temperature control shell of temperature control system 200 may comprise a metal material (e.g., comprising aluminum, an aluminum alloy, steel, nickel alloy, and/or the like), ceramics with high thermal conductivity, and/or any other suitable material.

In various embodiments, one or more of the temperature control shells of temperature control system 200 may be wrapped in an insulator material, such that at least a portion one or more of the temperature control shells is covered by the insulator. For example, the insulator may comprise rubber, a polymeric material (e.g., polyether ether ketone), and/or any other suitable material.

In various embodiments, the temperature control shells of temperature control system 200 may each comprise an aperture into the body of each temperature control shells wherein a thermocouple 211 may couple. Thermocouples 211 may be inserted into the apertures and may be configured to measure the temperature of the respective temperature control shell(s). Thermocouples 211 may be coupled to the respective temperature control shells via tight fit, threading, and/or the like. In various embodiments, the tips of thermocouples 211 may be spring-loaded having a bias, such that, in response to being inserted into the apertures of the temperature control shells, the tips of thermocouples 211 may be loaded into the material of the respective temperature control shell for sufficient contact therewith (resulting in more accurate temperature readings). Thermocouples 211 can include any suitable thermocouple. Exemplary thermocouples suitable for use as thermocouples 211 are available from OMEGA Engineering.

Each temperature control shell may comprise multiple thermocouples 211, such that if one thermocouple 211 fails or malfunctions, the other may serve as a backup and provide the desired temperature measurement.

In various embodiments, a controller in reactor system 50 (an example of controller 8 in FIG. 1A) may be in electronic communication with one or more other components of reactor system 50. For example, the controller may be in electronic communications with thermocouples 211 and/or the temperature adjustment devices. In various embodiments, one controller may be in electronic communication with all thermocouples 211 and temperature adjustment devices comprised in temperature control system 200. In various embodiments, a controller may be electronically coupled to one or more thermocouples 211 and temperature adjustment devices, and a second controller may be electronically coupled to other thermocouples 211 and temperature adjustment devices.

The controller can be configured to perform various functions and/or steps as described herein. The controller can include one or more processors, microprocessors, memory elements, and/or switching elements to perform the various functions. By way of examples, the controller can be used to control flow the gas flowing through chemical delivery system 100 (via mass flow controller 105, with which the controller may be in electronic communication), the heating or cooling of one or more of the temperature control shells (e.g., by heating or cooling temperature adjustment devices, for example, by increasing or decreasing current to a respective temperature adjustment device), the opening and closing of various valves (e.g., the accumulator inlet and outlet valves), and/or the like. In various embodiments, the controller may comprise a proportional-integral-derivative (PID) controller, which allows closed-loop control of the heating and/or cooling of the temperature control shells of temperature control system 200, and/or portions thereof.

Figure 5:
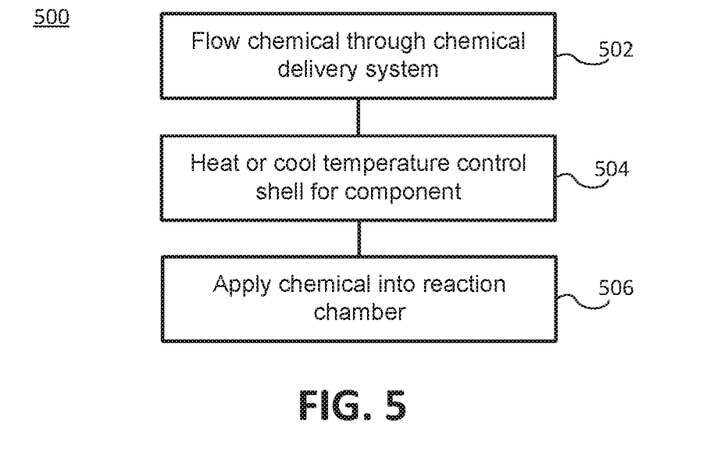
FIG. 5 illustrates a method for delivering a chemical through a chemical delivery system to a reaction chamber, in accordance with various embodiments of the present disclosure.

In operation, referring additionally to method 500 in FIG. 5 for delivering a chemical through a chemical delivery system to a reaction chamber, one or more of the temperature control shells in temperature control system 200 may be heated or cooled (step 504) to a desired temperature (e.g., a temperature within a desired temperature range). In various embodiments, the controller of reactor system 50 may cause the temperature adjustment device to heat or cool one or more temperature control shells in temperature control system 200 to achieve the desired temperature. For example, controller may send more current to a heater to heat the respective temperature control shells, may decrease the current to a heater to decrease the heat emitted by the heater, may increase the current to a cooling coil to cool the respective temperature control shells, decrease the current to a cooling coil to cause less cooling to the respective temperature control shells, or the like.

Heating or cooling a temperature control shell of temperature control system 200 may be in response to the controller detecting that the temperature of the respective temperature control shell is not within a desired temperature range. For example, a thermocouple 211 coupled to the respective temperature control shell may measure the temperature of the temperature control shell and transmit the temperature information to the controller. The controller may compare the received temperature information to a desired temperature and/or temperature range for that temperature control shell or region of temperature control system 200 and/or chemical delivery system 100. In response to the measured temperature differing from the desired temperature and/or being outside of the desired temperature range, the controller may cause the heating or cooling of the respective temperature control shell or region of temperature control system 200 until the desired temperature is achieved.

A gas may be flowed through chemical delivery system 100 (step 502) from gas source 12 to reaction chamber 32. The heating or cooling of one or more temperature control shells or a region temperature control system 200 may occur before, during, and/or after gas is flowing through chemical delivery system 100. That is, temperature control system 200 and chemical delivery system 100, and components or portions thereof, may be heated to a certain temperature (e.g., within a temperature range) before the gas begins flowing through chemical delivery system 100, and while the gas is flowing through chemical delivery system 100. This may avoid condensation or deposition of the flowing chemical within chemical delivery system 100 throughout the duration of gas flow.

The chemical flowing through chemical delivery system 100 may be applied into reaction chamber 32 (step 506), for example, for deposition on a substrate, cleaning the reaction chamber, etching, or any other desired effect.

The systems and methods described herein, allow for precise maintenance of a desired temperature or temperature range throughout a chemical delivery. Therefore, more temperature-sensitive chemicals may be utilized in gas-phase reactors and the methods performed using such reactors (e.g., ALD, CVD, etc.). A desired temperature or temperature range may be maintained within plus or minus 5° C., plus or minus 3° C., or plus or minus 1.5° C. For other applications, a range maintained within plus or minus 10° C. or within plus or minus 15° C. may be acceptable. For example, as determined through experimentation, a reactor system (such as those discussed herein) including a chemical delivery system comprising a chemical delivery line, a filter, an accumulator, two chemical application lines, a pressure line, and a pressure transducer, and a temperature control system including a delivery line temperature control shell, a filter temperature control shell, an accumulator temperature control shell, application line temperature control shells, and a pressure line temperature control shell, each coupled to and enclosing the respective component of the chemical delivery system, wherein each temperature control shell comprised aluminum, maintained a target temperature of 150° C. within plus or minus 1.5° C. The same reactor system with the same chemical delivery system and temperature control system maintained a target temperature of 220° C. within plus or minus 3° C.

Although exemplary embodiments of the present disclosure are set forth herein, it should be appreciated that the disclosure is not so limited. For example, although reactor systems are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

What is claimed is:

1. A temperature control system for a chemical delivery system, comprising:
a filter temperature control shell enclosing a filter of the chemical delivery system;
an accumulator temperature control shell enclosing an accumulator of the chemical delivery system, wherein the accumulator is downstream from the filter, wherein the filter is in fluid communication with and disposed between the accumulator and a mass flow controller;

an application line temperature control shell enclosing a chemical application line of the chemical delivery system, wherein the chemical application line is in fluid communication with the accumulator; and a delivery line temperature control shell enclosing a chemical delivery line, the chemical delivery line fluidly coupling the mass flow controller to the filter, wherein:

the filter temperature control shell, the accumulator temperature control shell, the delivery line temperature control shell, and the application line temperature control shell each comprise a shell housing, a shell temperature adjustment element coupled to the shell housing and a source to facilitate heating or cooling, and one or more thermocouples coupled to the shell housing, at least one of:
the filter temperature control shell comprises a filter retainer disposed within a portion of a filter shell cavity directly in contact with the filter, wherein no other portion of the filter temperature control shell other than a filter retainer directly contacts the filter, the accumulator temperature control shell comprises an accumulator retainer disposed within a portion of an accumulator shell cavity directly in contact with the accumulator, wherein no other portion of the accumulator temperature control shell other than an accumulator retainer directly contacts the accumulator, and the application line temperature control shell comprises a chemical application line retainer disposed within a portion of a chemical application line shell cavity configured to directly contact the chemical application line, wherein no other portion of the application line temperature control shell other than a chemical application line retainer directly contacts the chemical application line.

2. The temperature control system of claim 1, wherein each of the filter temperature control shell, the accumulator temperature control shell, and the application line temperature control shell comprises two pieces coupled together, wherein each of the two pieces of the filter temperature control shell comprises a filter half cavity that is complementary to the filter, wherein the filter half cavity of each of the two pieces of the filter temperature control shell together form the filter shell cavity such that the filter is disposed therein, wherein each of the two pieces of the accumulator temperature control shell comprises an accumulator half cavity that is complementary to the accumulator, wherein the accumulator half cavity of each of the two pieces of the accumulator temperature control shell together form the accumulator shell cavity such that the accumulator is disposed therein, and wherein each of the two pieces of the application line temperature control shell comprises a chemical application line half cavity that is complementary to the chemical application line, wherein the chemical application line half cavity of each of the two pieces of the application line temperature control shell together form the chemical application line shell cavity such that the chemical application line is disposed therein.

3. The temperature control system of claim 2, wherein each of the filter temperature control shell, the accumulator temperature control shell, and the application line temperature control shell comprises an aperture comprising a thermocouple disposed therein.

4. The temperature control system of claim 2, wherein the accumulator temperature control shell comprises a horizontal temperature control shell and a vertical temperature control shell that are collectively enclosing the accumulator, wherein the accumulator is T-shaped.

5. The temperature control system of claim 2, wherein each of the filter temperature control shell, the accumulator temperature control shell, and the application line temperature control shell comprises at least one of a metal comprising at least one of aluminum, steel, and nickel, and a ceramic material.

6. The temperature control system of claim 2, wherein each of the filter temperature control shell, the accumulator temperature control shell, and the application line temperature control shell is configured to maintain a temperature within 5 degrees Celsius of a desired temperature.

7. The temperature control system of claim 1, further comprising a pressure line temperature control shell enclosing a pressure line, wherein the pressure line is in fluid communication with the accumulator.

8. A chemical delivery system, comprising:
a filter;
a mass flow controller;
a filter temperature control shell coupled to and enclosing the filter, wherein the filter is downstream from the mass flow controller;
a chemical delivery line extending from an outlet of the mass flow controller to an inlet of the filter;
a delivery line temperature control shell coupled to and enclosing the chemical delivery line;
an accumulator disposed between a pressure transducer and the filter, the accumulator comprising an inlet valve and an outlet valve;
an accumulator temperature control shell coupled to and enclosing the accumulator;
a chemical application line in fluid communication with and downstream from the accumulator; and
an application line temperature control shell coupled to and enclosing the chemical application line, wherein at least one of:
the filter temperature control shell comprises a filter retainer disposed within a portion of a filter shell cavity that is directly contacting the filter, wherein the filter retainer is the only portion of the filter temperature control shell that directly contacts the filter,
the accumulator temperature control shell comprises an accumulator retainer disposed within a portion of an accumulator shell cavity that is directly contacting the accumulator, wherein the accumulator retainer is the only portion of the accumulator temperature control shell that directly contacts the accumulator, and
the application line temperature control shell comprises a chemical application line retainer disposed within a portion of a chemical application line shell cavity that is directly contacting the chemical application line, wherein the chemical application line retainer is the only portion of the application line temperature control shell that directly contacts the chemical application line.

9. The chemical delivery system of claim 8, wherein each of the filter temperature control shell, the accumulator temperature control shell, the delivery line temperature control shell, and the application line temperature control shell comprises two pieces coupled together,
  wherein each of the two pieces of the filter temperature control shell comprises a filter half cavity that is complementary to the filter, wherein the filter half cavity of each of the two pieces of the filter temperature control shell together form the filter shell cavity, wherein the filter is disposed in the filter shell cavity,
  wherein each of the two pieces of the accumulator temperature control shell comprises an accumulator half cavity that is complementary to the accumulator, wherein the accumulator half cavity of each of the two pieces of the accumulator temperature control shell together form the accumulator shell cavity, wherein the accumulator is disposed in the accumulator shell cavity, and
  wherein each of the two pieces of the application line temperature control shell comprises a chemical application line half cavity that is complementary to the chemical application line, wherein the chemical application line half cavity of each of the two pieces of the application line temperature control shell together form the chemical application line shell cavity, wherein the chemical application line is disposed in the chemical application line shell cavity.

10. The chemical delivery system of claim 9, wherein each of the filter temperature control shell, the accumulator temperature control shell, and the application line temperature control shell comprises an aperture comprising a thermocouple disposed therein.

11. The chemical delivery system of claim 9, wherein each of the filter temperature control shell, the accumulator temperature control shell, and the application line temperature control shell comprises at least one of a metal comprising at least one of aluminum, steel, and nickel, and a ceramic material.

12. The chemical delivery system of claim 9, wherein each of the filter temperature control shell, the accumulator temperature control shell, and the application line temperature control shell is configured to maintain a temperature within 5 degrees Celsius of a desired temperature.

13. The chemical delivery system of claim 9, further comprising a pressure line fluidly coupled to and between the pressure transducer and the accumulator; and a pressure line temperature control shell coupled to and enclosing the pressure line.

14. The chemical delivery system of claim 8, wherein at least one of the filter temperature control shell, the accumulator temperature control shell, and the application line temperature control shell comprises a temperature adjustment device configured to adjust a temperature of at least one of the filter temperature control shell, the accumulator temperature control shell, and the application line temperature control shell, wherein the chemical delivery system further comprises a controller in electronic communication with a temperature control device, wherein the controller is configured to adjust a temperature of the temperature adjustment device, and wherein the temperature control device comprises the filter temperature control shell, the accumulator temperature control shell, and the application line temperature control shell.

15. The chemical delivery system of claim 8, further comprising a retainer protruding into a cavity of at least one of the filter temperature control shell, the accumulator temperature control shell, the delivery line temperature control shell, and the application line temperature control shell, the retainer configured to hold one of the chemical delivery line, the filter, the accumulator, or the chemical application line in place.

16. A method of delivering a chemical to a reaction chamber, comprising:
  flowing the chemical through a filter of a chemical delivery system, an accumulator of the chemical delivery system fluidly coupled to and downstream of the filter, and a chemical application line of the chemical delivery system fluidly coupled to and downstream of the accumulator;
  heating or cooling a filter temperature control shell coupled to and enclosing the filter to a first temperature between a sublimation temperature and a degradation temperature of the chemical at least one of before and during the flowing the chemical;
  heating or cooling an accumulator temperature control shell coupled to and enclosing the accumulator to a second temperature between the sublimation temperature and the degradation temperature of the chemical at least one of before and during the flowing the chemical; and
  heating or cooling an application line temperature control shell coupled to and enclosing the chemical application line to a third temperature between the sublimation temperature and the degradation temperature of the chemical at least one of before and during the flowing the chemical, wherein at least one of:
    the filter temperature control shell comprises a filter retainer disposed within a portion of a filter shell cavity directly in contact with the filter, wherein no other portion of the filter temperature control shell other than a filter retainer directly contacts the filter,
    the accumulator temperature control shell comprises an accumulator retainer disposed within a portion of an accumulator shell cavity directly in contact with the accumulator, wherein no other portion of the accumulator temperature control shell other than an accumulator retainer directly contacts the accumulator, and
    the application line temperature control shell comprises a chemical application line retainer disposed within a portion of a chemical application line shell cavity configured to directly contact the chemical application line, wherein no other portion of the application line temperature control shell other than a chemical application line retainer directly contacts the chemical application line.

17. A reactor system comprising:
  the temperature control system of claim 1; and
  a controller in electronic communication with the shell temperature adjustment element of the filter temperature control shell, the accumulator temperature control shell, and the application line temperature control shell, the controller configured to:
    detect that a temperature of a respective temperature control shell is not within a desired temperature range, the respective temperature control shell including one of the filter temperature control shell, the accumulator temperature control shell, and the application line temperature control shell, and
    in response to the detecting that the temperature is not within the desired temperature range, causing the shell temperature adjustment element corresponding to the respective temperature control shell to heat or cool the respective temperature control shell to a desired temperature within the desired temperature range.

18. A reactor system, comprising:

the chemical delivery system of claim 8;

a reaction chamber fluidly coupled to the chemical application line; and a controller in electronic communication with the mass flow controller and a temperature adjustment element for each of the filter temperature control shell, the accumulator temperature control shell, the delivery line temperature control shell, and the application line temperature control shell, the controller configured to:

flow a chemical from the mass flow controller through the chemical delivery line, the filter, the accumulator, and the chemical application line to the reaction chamber, heat or cool the delivery line temperature control shell to a first temperature between a sublimation temperature and a degradation temperature of the chemical at least one of before and during the flowing the chemical, heat or cool the filter temperature control shell to a second temperature between the sublimation temperature and the degradation temperature of the chemical at least one of before and during the flowing the chemical, heat or cool the accumulator temperature control shell to a third temperature between the sublimation temperature and the degradation temperature of the chemical at least one of before and during the flowing the chemical; and heat or cool the application line temperature control shell to a fourth temperature between the sublimation temperature and the degradation temperature of the chemical at least one of before and during the flowing the chemical.

19. A chemical delivery system, comprising:

a filter;

a mass flow controller;

a filter temperature control shell coupled to and enclosing the filter, wherein the filter is downstream from the mass flow controller;

a chemical delivery line extending from an outlet of the mass flow controller to an inlet of the filter;

a delivery line temperature control shell coupled to and enclosing the chemical delivery line;

an accumulator disposed between a pressure transducer and the filter, the accumulator comprising an inlet valve and an outlet valve;

an accumulator temperature control shell coupled to and enclosing the accumulator;

a chemical application line in fluid communication with and downstream from the accumulator; and an application line temperature control shell coupled to and enclosing the chemical application line, wherein greater than 70% of a cavity surface area for each of the filter temperature control shell, the accumulator temperature control shell, the delivery line temperature control shell, and the application line temperature control shell is disposed proximate to, but not in direct contact with, a respective component from one of the chemical delivery line, the filter, the accumulator, or the chemical application line in place.

* * * * *